(12) United States Patent
Yasumitsu et al.

(10) Patent No.: US 6,965,115 B2
(45) Date of Patent: Nov. 15, 2005

(54) AIRTIGHT PROCESSING APPARATUS, AIRTIGHT PROCESSING METHOD, AND ELECTRON BEAM PROCESSING APPARATUS

(75) Inventors: Naoki Yasumitsu, Yokohama (JP); Eiichi Hiraoka, Kodaira (JP); Yoshiyuki Tomita, Hiratsuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/875,166

(22) Filed: Jun. 25, 2004

(65) Prior Publication Data
US 2004/0263819 A1 Dec. 30, 2004

(30) Foreign Application Priority Data
Jun. 26, 2003 (JP) .......................... P2003-182872

(51) Int. Cl.[7] .............................. G01J 1/00; G21G 5/00; C23C 16/00
(52) U.S. Cl. .............................. 250/491.1; 250/492.2; 250/492.3; 118/728
(58) Field of Search .................. 250/491.1, 492.1, 250/492.2, 492.21, 492.22, 492.3; 118/728, 118/729; 204/298.25, 298.35, 298.24

(56) References Cited

U.S. PATENT DOCUMENTS

| 4,816,638 | A | * | 3/1989 | Ukai et al. ............. 219/121.43 |
| 5,391,260 | A | * | 2/1995 | Makino et al. ............... 216/69 |
| 5,520,742 | A | * | 5/1996 | Ohkase ....................... 118/724 |
| 5,607,510 | A | * | 3/1997 | Makino et al. ...... 118/723 MA |
| 6,375,750 | B1 | * | 4/2002 | van Os et al. ............. 118/728 |
| 6,444,374 | B1 | * | 9/2002 | Shimazu et al. ............... 430/5 |
| 6,767,429 | B2 | * | 7/2004 | Amano .................. 156/345.29 |
| 6,855,929 | B2 | * | 2/2005 | Kimba et al. ............... 250/310 |

FOREIGN PATENT DOCUMENTS

JP   2000-357646   12/2000

* cited by examiner

Primary Examiner—John R. Lee
Assistant Examiner—Bernard E. Souw
(74) Attorney, Agent, or Firm—Arent Fox PLLC

(57) ABSTRACT

An airtight processing apparatus comprises a chamber having a side wall and a bottom wall airtightly fixed to the side wall, and a bed supported inside the chamber by the side wall with a gap from the bottom wall.

14 Claims, 8 Drawing Sheets

AIRTIGHT PROCESSING APPARATUS, AIRTIGHT PROCESSING METHOD, AND ELECTRON BEAM PROCESSING APPARATUS

BACKGROUND OF THE INVENTION

1. Field of the Invention

The present invention relates to an airtight processing apparatus, an airtight processing method, and an electron beam processing apparatus.

2. Related Background Art

A vacuum apparatus comprising a chamber for processing a semiconductor wafer; and stages, disposed within the chamber, for positioning and holding the semiconductor wafer has conventionally been known (see, for example, Japanese Patent Application Laid-Open No. 2000-357646).

Usually, the stages are secured by being supported by three points at the bottom wall of the chamber or by being mounted to a highly rigid bed, which is supported by three points at the bottom wall of the chamber.

SUMMARY OF THE INVENTION

Since the vacuum apparatus is used with the pressure within the chamber being reduced so as to form a vacuum, walls (upper, bottom, and side walls, etc.) of the chamber may be deformed by the difference in pressure between the inside and outside. The vacuum apparatus in which the stages are supported by the bottom wall of the chamber, the stages will be displaced if the bottom wall deforms. When the stages are displaced, the semiconductor wafer to be processed is displaced.

In the vacuum apparatus in which the stages are mounted on the bed, the bed will be displaced if the bottom wall is deformed. If the bed is displaced, the stages mounted on the bed will indirectly be displaced, whereby the semiconductor wafer to be processed will be displaced.

Therefore, the position of the semiconductor wafer is displaced under reduced pressure in these vacuum apparatus. Though the semiconductor wafer position may be designed beforehand while taking account of the deformation in the bottom wall under reduced pressure, the deformation of the bottom wall may also vary depending on fluctuations in the external atmospheric pressure, which makes it difficult to secure a positional accuracy in the semiconductor wafer. For example, it is particularly important for an electron beam proximity exposure system in which exposure processing is carried out while an exposure mask and a sample are disposed close to each other to secure a positional accuracy (vertical positional accuracy in particular) of the sample to be processed, such as a semiconductor wafer.

Such deformations in the chamber may occur either when the pressure within the chamber is reduced or increased.

Therefore, in order to overcome the problem mentioned above, it is an object of the present invention to provide an airtight processing apparatus, an airtight processing method, and an electron beam processing apparatus which can secure a positional accuracy of a sample when the pressure within the chamber is reduced or increased.

The present invention provides an airtight processing apparatus comprising a chamber having a side wall and a bottom wall airtightly fixed to the side wall, and a bed supported inside the chamber by the side wall with a gap from the bottom wall.

Since a gap exists between the bottom wall of the chamber and the bed in this airtight processing apparatus, even if the bottom wall is deformed, the deformation of the bottom wall will not directly be transmitted as a displacement of the bed. Therefore, the influence of the deformation of the bottom wall upon the sample position can be minimized, whereby the positional accuracy in the sample (vertical positional accuracy in particular) can be secured.

Preferably, the airtight processing apparatus further comprises a sample holder placed on the bed. Preferably, the sample holder is attachable/detachable to the bed. In this case, the position of the bed is hardly influenced by deformations of the bottom wall, and the bed itself is substantially kept from flexing. Since the sample holder is detachably attached onto the bed, the sample holder does not move easily with respect to the bed, whereby a positional accuracy can be secured in the sample.

Preferably, the side wall of the chamber has upper and lower side walls. Preferably, the bed has an edge sandwiched between the upper and lower side walls, whereby the bed is supported by the side wall. This allows the bed to be supported easily and reliably.

Preferably, the bed comprises a plurality of holes. This can reduce the weight of the airtight processing apparatus.

Preferably, the bed is formed from pure iron. This can enhance the rigidity of the bed.

Preferably, the bed has a plated surface. This can prevent the bed from generating gases, whereby a high degree of vacuum can be secured in a vacuum environment, for example. Also, this can protect the surface of the bed against rust, etc.

Preferably, the airtight processing apparatus comprises a vacuum pump for evacuating the chamber. The airtight processing apparatus is suitably used in such a reduced pressure environment.

The present invention provides an electron beam processing apparatus comprising the airtight processing apparatus and an electron beam irradiating part for irradiating a sample with an electron beam.

Preferably, the chamber has an upper wall with a through hole airtightly fixed to the side wall. Preferably, the electron beam irradiating part is provided so as to be airtightly passed through the through hole and be slidable relative thereto. In this case, even if the upper wall of the chamber deforms, the deformation in the upper wall will not be transmitted to the electron beam irradiating part.

Preferably, the electron beam processing apparatus further comprises an irradiating part holder that holds the electron beam irradiating part. Preferably, the irradiating part holder is provided so as to bridge an edge of the upper wall of the chamber and the electron beam irradiating part. This allows the electron beam irradiating part to be held without being substantially influenced by deformations of the upper wall of the chamber.

Preferably, the electron beam processing apparatus further comprises a mask holder that holds a mask provided with a pattern to be transferred to the sample.

Preferably, the electron beam processing apparatus is an electron beam proximity exposure apparatus.

The present invention provides an airtight processing method comprising the steps of supporting a bed by a side wall of a chamber with a gap from a bottom wall of the chamber; holding a sample on the bed; and processing the sample within the chamber under reduced or increased pressure.

Since a gap exists between the bottom wall of the chamber and the bed in this method, even if the bottom wall of the chamber is deformed by a reduced or increased pressure, the deformation of the bottom wall will not directly be transmitted as a displacement of the bed. Therefore, the influence of the deformation of the bottom wall upon the sample position can be minimized, whereby the positional accuracy in the sample (vertical positional accuracy in particular) can be secured.

Preferably, the bed partitions the chamber into first and second airtight rooms, whereas the first and second airtight rooms are maintained at substantially the same pressure. This restrains the bed from deforming, and thus improves the positional accuracy.

The present invention will become more fully understood from the detailed description given hereinbelow and the accompanying drawings. They are given by way of illustration only, and thus should not be considered limitative of the present invention.

BRIEF DESCRIPTION OF THE DRAWINGS

FIG. 3A is a perspective view of a bed as seen from its upper face, whereas

DETAILED DESCRIPTION OF THE PREFERRED EMBODIMENTS

In the following, embodiments of the present invention will be explained. Constituents identical to each other will be referred to with numerals identical to each other without repeating their overlapping descriptions.

Figure 1:
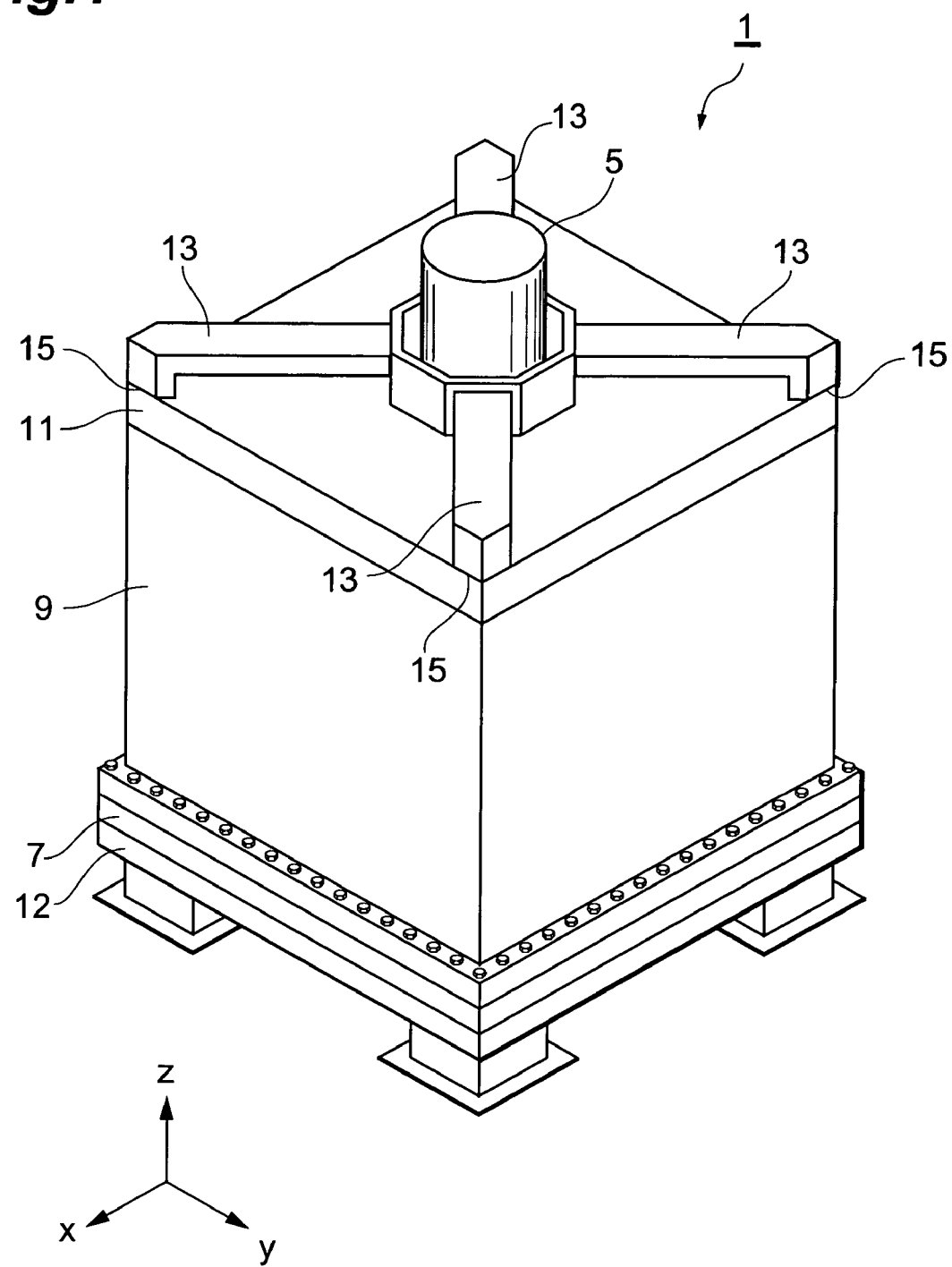
FIG. 1 is a perspective view of an exposure apparatus.
Figure 2:
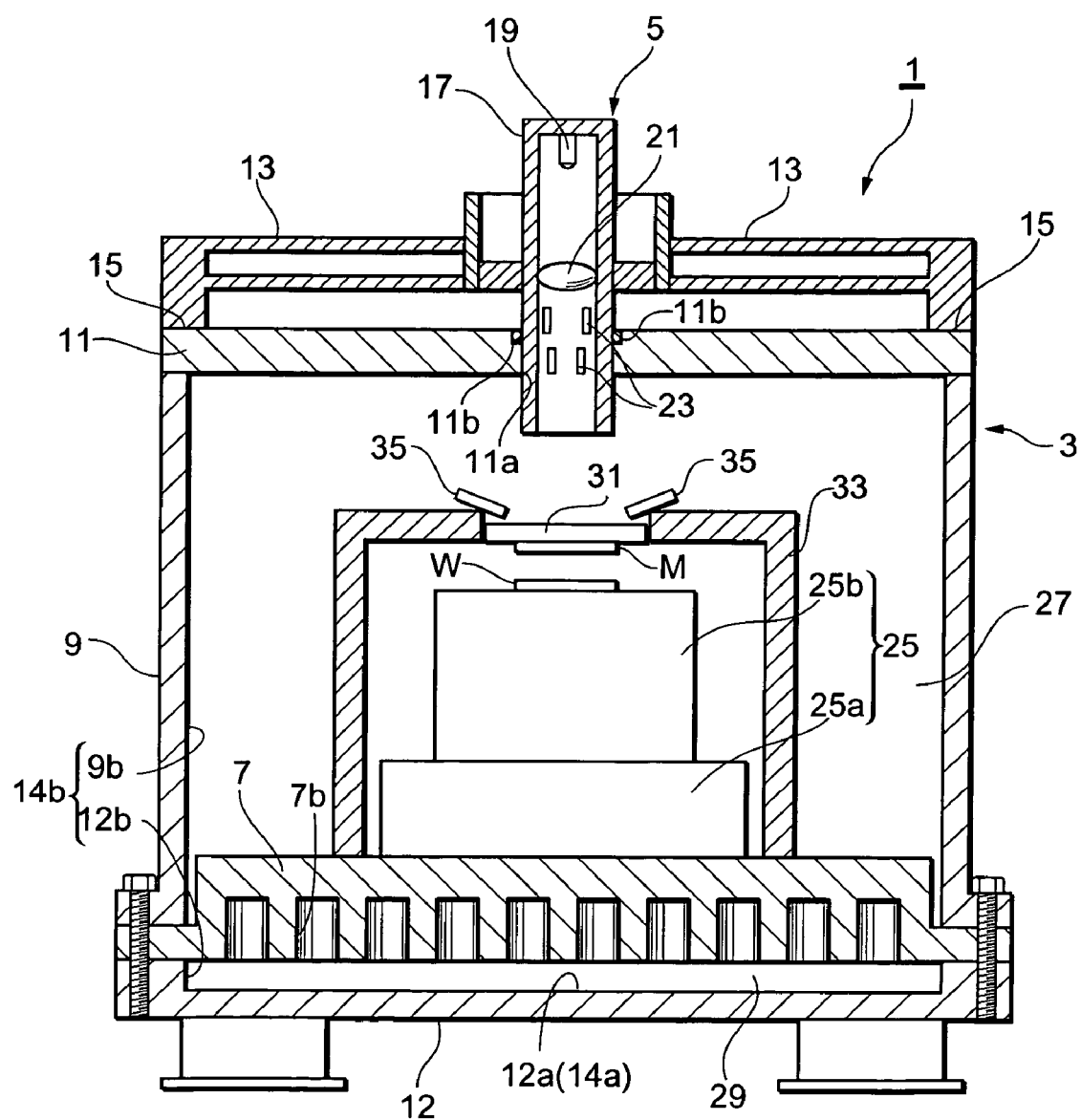
FIG. 2 is a sectional view of the exposure apparatus.

FIG. 1 is a perspective view showing the configuration of the electron beam proximity exposure apparatus (electron beam processing apparatus) 1 in accordance with an embodiment. FIG. 2 is a sectional view of the electron beam proximity exposure apparatus (also simply referred to as "exposure apparatus" in the following). As depicted, the exposure apparatus 1 comprises a chamber 3, an electron beam irradiating part 5, and a bed 7. As shown in FIG. 1, horizontal directions are defined as x and y directions, and a vertical direction is defined as z direction, which will hereinafter be used for explanation when necessary.

The chamber 3 comprises a container body 9 with open upper and lower ends, an upper lid 11 for closing the upper opening of the container body 9, and a bottom lid 12 for closing the lower opening. The container body 9 comprises four side wall parts (upper side walls) 9b which extend vertically (along the z axis). The bottom lid 12 comprises a bottom wall part 12a having a rectangular horizontal cross section, and side wall parts (lower side walls) 12b rising from edge portions of the bottom wall part 12a. The side wall parts 9b and 12b form side wall parts (side walls) 14b of the chamber, whereas the bottom wall part 12a constitutes a bottom wall part 14a of the chamber. The upper lid 11 has a rectangular horizontal cross section with a circular through hole 11a formed at the center. The upper lid 11 and the container body 9 are formed from pure iron. The bottom lid 12 is made of stainless steel (SUS304).

The electron beam irradiating part 5 shaped like a circular column is passed through the through hole 11a vertically (along the z axis). An O-ring 11b is placed between the rim of the through hole 11a and the electron beam irradiating part 5. While in a state where the gap between the rim of the through hole 11a and the electron beam irradiating part 5 is sealed, the electron beam irradiating part 5 is slidable vertically (along the z axis) relative to the upper lid 11. The electron beam irradiating part 5 is held by four irradiating part holders 13 at a part projecting out of the through hole 11a. The irradiating part holders 13 are disposed on the upper lid 11. One ends of the four irradiating part holders 13 are secured to respective edge portions of the upper lid 11, more specifically to corners 15 of the rectangle of the upper lid 11, whereas the other ends are secured to side wall parts of the electron beam irradiation part 5. The parts between both ends are distanced from the upper lid 11. Each irradiating part holder 13 has a quadrangular cross section with a hollow structure for reducing the weight.

The electron beam irradiating part 5 comprises an electron lens barrel 17 including an upper wall part and a side wall part, an electron gun 19 disposed at the upper wall part within the electron lens barrel 17, a lens 21 for collimating the electron beam emitted from the electron gun 19, and a deflector 23. The electron gun 19, lens 21, and deflector 23 are arranged in this order toward the vertically lower side, so that the electron beam emitted from the electron gun 19 is collimated by the lens 21 and then is swept by the deflector 23, so as to irradiate a semiconductor wafer W.

Figure 3A:
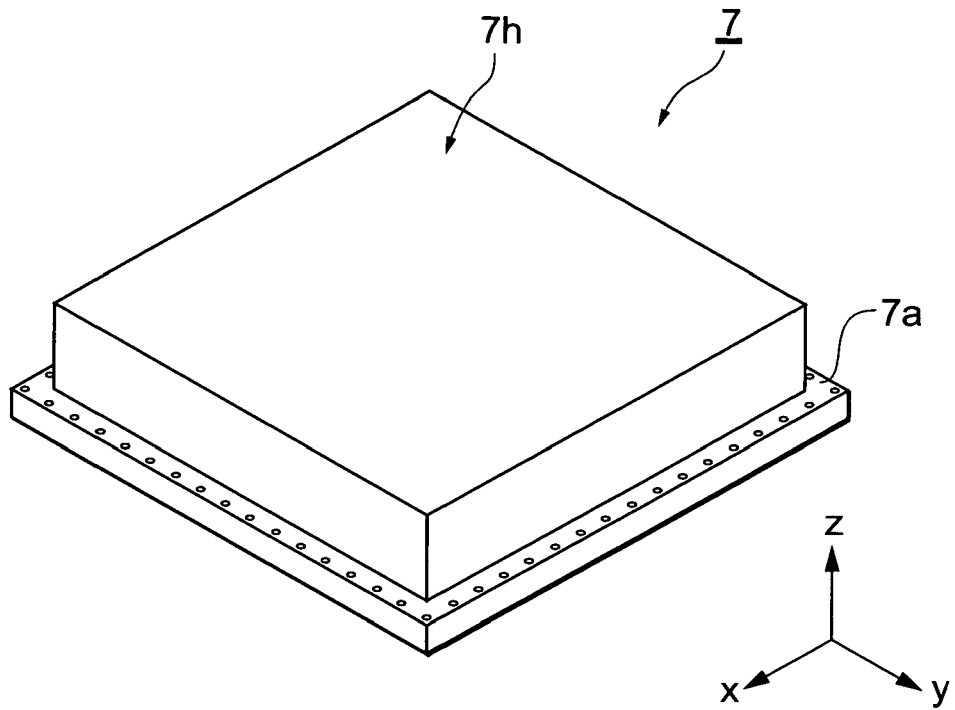
Figure 3B:
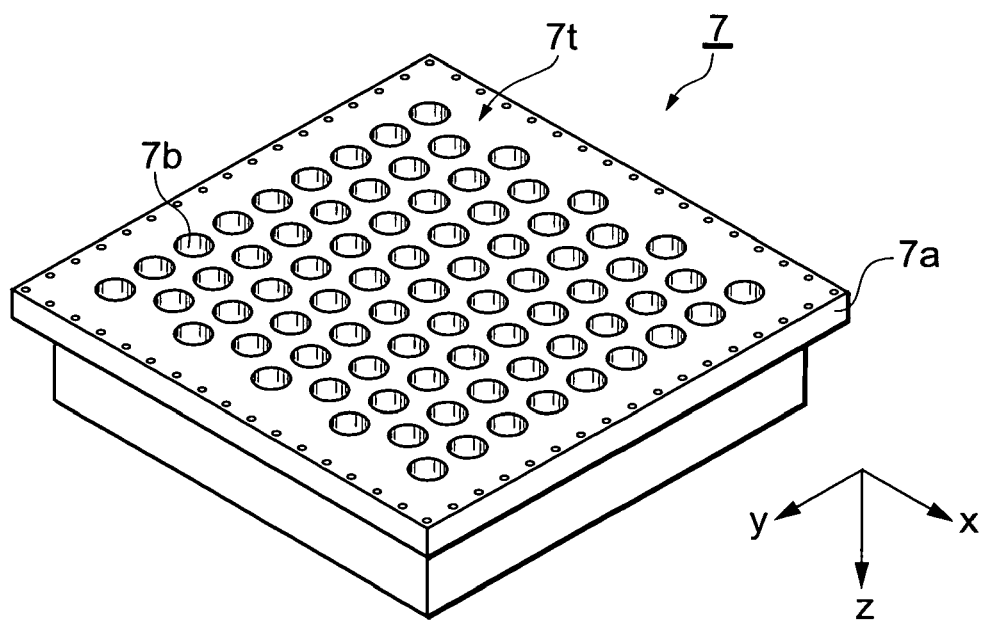
FIG. 3B is a perspective view of the bed as seen from its bottom face.

FIG. 3A is a perspective view of the bed 7 as seen from its upper face, whereas FIG. 3B is a perspective view of the bed 7 as seen from its bottom face. As depicted, the bed 7 is shaped like a quadrangular prism extending along the xy plane with a flange 7a horizontally projecting from the lowermost part of its side faces. The bed 7 has a mounting surface 7h on the upper face side. The mounting surface 7h is a flat surface on which a wafer stage (sample holder) 2 for positioning and holding the semiconductor wafer W is mounted. As depicted, a number of holes 7b, each of which is shaped like a circular column and extends along the z axis from the bottom face 7t side of the bed 7 without penetrating therethrough, are arranged into a matrix like a honeycomb. The bed 7 is made of pure iron with its surface coated with nickel by electroless plating.

The flange 7a is sandwiched between the side wall parts 9b of the container body 9 and the side wall parts 12b of the bottom lid 12, whereby the bed 7 is held and positioned by the side wall parts 14b of the chamber. The space within the chamber defined by the upper lid 11, container body 9, and bottom lid 12 is partitioned by the bed 7 so as to be divided into two along the z axis. Thus obtained two spaces constitute a first vacuum chamber (first airtight room) 27 and a second vacuum chamber (second airtight room) 29, respectively. Namely, the space defined by the upper lid 11, side wall parts 9b, and bed 7 constitutes the first airtight room 27, whereas the space defined by the bottom wall part 12a, side wall parts 12b, and bed 7 constitutes the second vacuum chamber 29. The respective spaces of the cylindrical holes 7b formed in the bottom face 7t of the bed 7 are also included in the second vacuum chamber 29.

Within the first vacuum chamber 27, a wafer stage 25 for holding the semiconductor wafer (sample) W to be exposed to light is accommodated. The wafer stage 25 can adjust the position and inclination of the wafer W by using a driving mechanism which is not depicted, so as to carry out fine positioning of the wafer W in the rotational direction (θz) within the horizontal plane, x direction, y direction, and inclination (θx, θy). The wafer stage 25 is secured such that the bottom of a stage base 25a is closely in contact with the mounting surface 7h of the bed 7.

Figure 4:
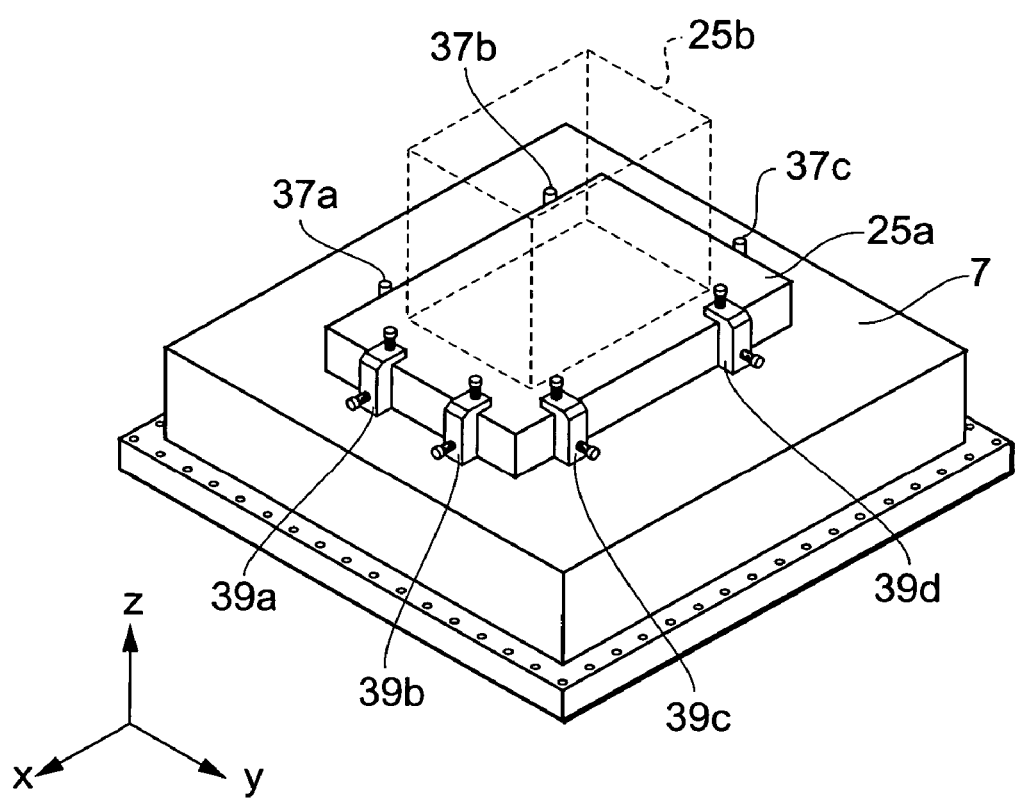
FIG. 4 is a view showing a state where a stage base of a wafer stage is secured to the bed.

FIG. 4 shows a state where the stage base 25a of the wafer stage 25 is attached to the bed 7. Positioning pins 37a, 37b, 37c vertically project from the mounting surface 7h. When the stage base 25a is brought into contact with the positioning pins 37a, 37b, the y-directional position of the stage base 25a is defined. When the stage base 25a is brought into contact with the positioning pin 37c, the x-directional position of the stage base 25a is defined. Since the stage base 25a comes into contact with the three points of the positioning pins 37a, 37b, 37c at the same time, the θz-directional position of the stage base 25a is also defined. After being positioned by the positioning pins 37a, 37b, 37c, the stage base 25a is secured to the mounting surface 7h by clamps 39a, 39b, 39c, 39d. Namely, the wafer stage 25 is constructed so that it can be fixed by securing means of the clamps 39a, 39b, 39c, 39d and positioning pins 37a, 37b, 37c. Since the securing means are resistant to loads in the x, y, z, θx, θy, and θz directions, the wafer stage 25 and the bed 7 do not change the positional relationship therebetween even when receiving these loads. Here, the clamps 39a, 39b, 39c, 39d are removable from the mounting surface 7h.

Also accommodated in the first vacuum chamber 27 is a mask stage (mask holder) 31 for positioning and holding a mask M formed with a desirable pattern. By using a driving mechanism which is not depicted, the mask stage 31 can change the position and inclination of the mask M, thereby carrying out fine positioning in the rotational direction (θz) within the horizontal plane, x direction, y direction, and inclination (θx, θy). The mask stage 31 is mounted on a reference base 33 raised from the mounting surface 7h of the bed 7. The whole surface of the mask M is scanned with the electron beam emitted from the electron beam irradiating part 5, whereby the desirable pattern is transferred to a resist on the semiconductor wafer W at the magnification of 1:1.

Also disposed within the first vacuum chamber is a photodetector 35 such as a white light microscope, which irradiates the mask M and semiconductor wafer W with light and detects light scattered by alignment marks which are not depicted. The photodetector 35 is mounted on the reference base 33. The data detected by the photodetector 35 is sent to and processed by an image processor which is not depicted, whereby the positional relationship between the mask M and semiconductor wafer W is determined from how the alignment marks overlap each other. When a positional deviation exists between the mask M and the semiconductor wafer W, a signal for correcting the position of the mask M and/or semiconductor wafer W is generated, and the position of the mask M and/or semiconductor wafer W is minutely corrected according to this signal. Thus, the mask M and the semiconductor wafer W are precisely positioned with respect to each other. In this embodiment, the mask M is disposed close to the semiconductor wafer W (with a gap therebetween on the order of 10 to 100 $\mu$m).

Figure 5:
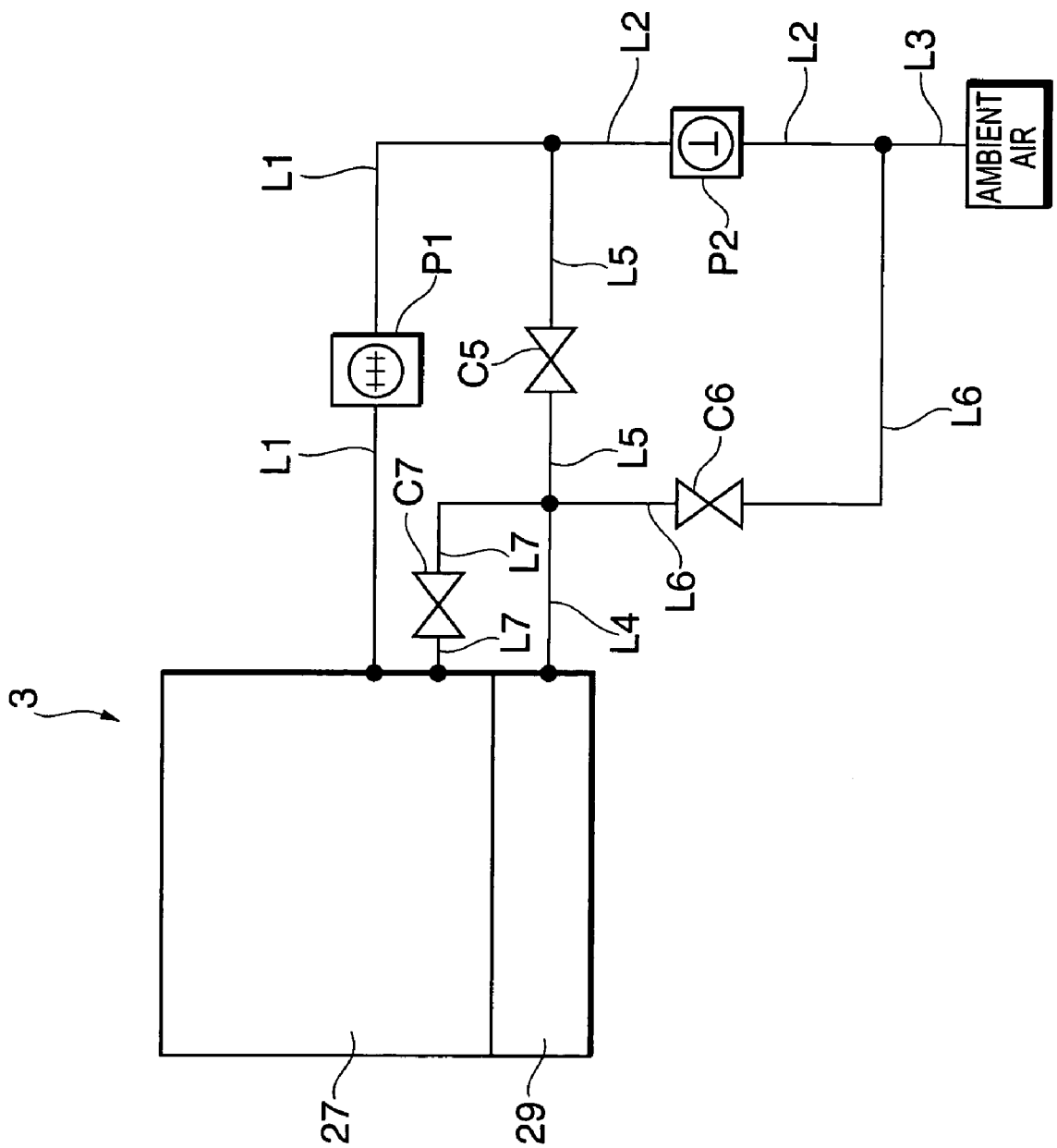
FIG. 5 is a diagram showing a vacuum exhaust system for evacuating a chamber.

In order for the wafer W to be irradiated with the electron beam under reduced pressure, the first vacuum chamber 27 is evacuated by a vacuum pump or the like, so as to lower the pressure. At this time, the pressure of the second vacuum chamber 29 is also reduced. FIG. 5 shows a vacuum exhaust system for evacuating the chamber 3. The vacuum exhaust system shown in FIG. 5 includes lines L1 to L7 for exhausting/feeding air from/to the first vacuum chamber 27 and second vacuum chamber 29. A turbomolecular pump P1 is disposed on the line L1, whereas a dry pump P2 is disposed on the line L2. Compressed air angle valves C5, C6, and C7 are disposed on the lines L5, L6, and L7, respectively.

The first vacuum chamber 27 and second vacuum chamber 29 are evacuated in the following manner. First, in the state where the compressed air angle valves C6 and C7 are closed whereas the compressed air angle valve C5 is opened, rough evacuation is performed by the dry pump P2. The dry pump P2 exhausts air from the first vacuum chamber 27 by way of the lines L1, L2, L3, and from the second vacuum chamber 29 by way of the lines L4, L5, L2, L3. Namely, the dry pump P2 evacuates the first vacuum chamber 27 and second vacuum chamber 29 at the same time. For the first vacuum chamber 27 in which electron beam irradiation is to be carried out, formal evacuation is effected by the turbomolecular pump P1 in order to achieve a higher degree of vacuum. The formal evacuation is effected by driving the turbomolecular pump P1 and dry pump P2 while in a state where the compressed air angle valves C5, C6, C7 are closed. In this state, the first vacuum chamber 27 and the second vacuum chamber 29 are maintained at substantially the same pressure. For breaking the vacuum state in the first vacuum chamber 27 and second vacuum chamber 29, on the other hand, the compressed air angle valves C6, C7 are opened while in a state where the compressed air angle valve C5 is closed, so as to supply both vacuum chambers with air from the outside.

Figure 6:
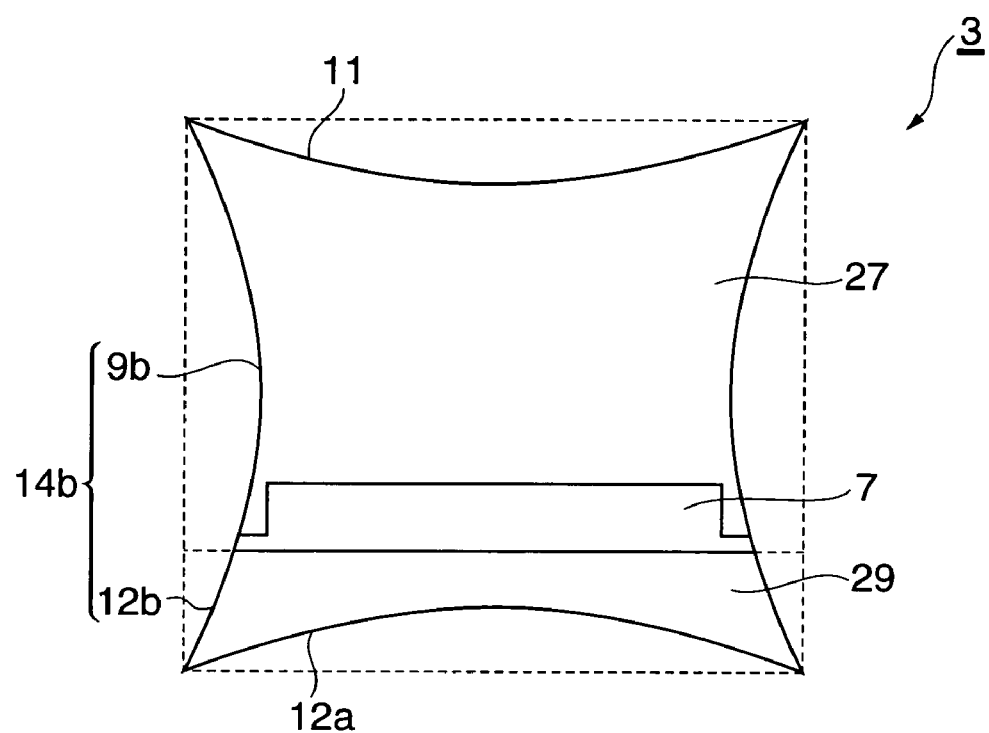
FIG. 6 is a diagram schematically showing a deformation of the chamber under reduced pressure.

FIG. 6 is a diagram schematically showing a deformation of the chamber 3 (comprising the first vacuum chamber 27 and second vacuum chamber 29) under reduced pressure. Broken lines indicate the form of the chamber 3 before being evacuated by the vacuum exhaust system (hereinafter referred to as "before the evacuation"), whereas solid lines represent the form of the chamber 3 after being evacuated by the vacuum exhaust system (hereinafter referred to as "after the evacuation"). After the evacuation, uniform loads directed from the outside to the inside are applied to the upper lid 11, side wall parts 14b, and bottom wall part 12a because of the difference in pressure between the inside and outside of the chamber. As depicted, the uniform loads cause each member to flex inward, so as to make it deform. Here, though the bed 7 receives bending and vertical stresses due to the deformation of the side wall parts 14b, the displacement of the bed 7 caused by these stresses is negligibly smaller than the amount of deformation in the bottom wall part 12a.

Since the bed 7 is thus supported by the side wall parts 14b and distanced from the bottom wall part 12a in the chamber 3 in the exposure apparatus 1, the influence of the deformation of the bottom wall part 12a after the evacuation is not directly transmitted to the bed 7, whereby the displacement in the bed 7 due to the evacuation, the z-directional displacement in particular, can be minimized. Also, since the first vacuum chamber 27 and the second vacuum chamber 29 are substantially maintained at the same pressure, the bed 7 can further be restrained from deforming.

Figure 7:
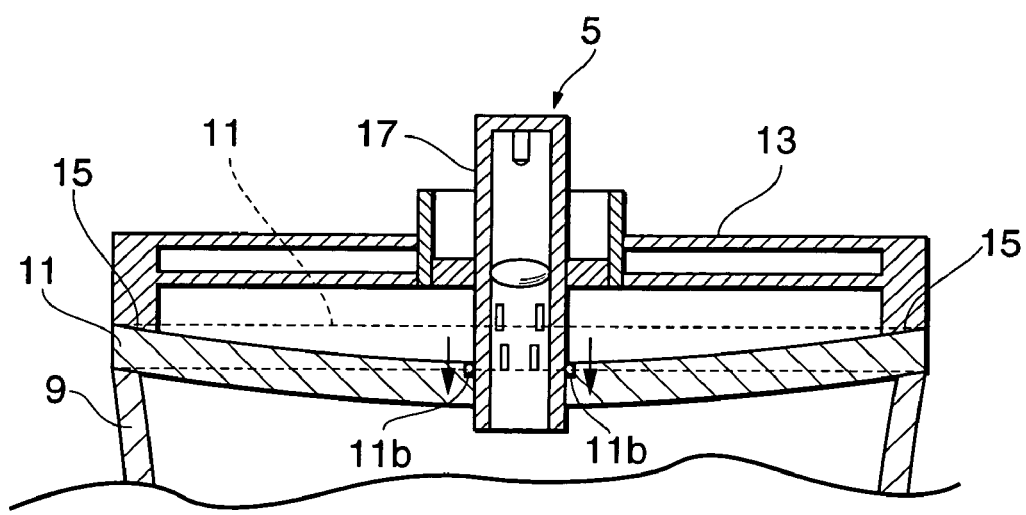
FIG. 7 is a view showing a deformation in the vicinity of an electron beam irradiating part under reduced pressure.

FIG. 7 is a view showing a deformation in the vicinity of the electron beam irradiating part 5 under reduced pressure. Broken lines indicate the form of the upper lid 11 before the evacuation. As mentioned above, the upper lid 11 after the evacuation flexes inward, so as to deform. Also, as mentioned above, the electron beam irradiating part 5 is not secured to the upper lid 11 but is supported by the irradiating part holders 13, which are fixed to the corners 15 of the upper lid 11. Since the displacement of the corners 15 due to the deformation of the chamber 3 after the evacuation is relatively small, the displacement of the irradiating part holders 13 and the displacement of the electron beam irradiating part 5 supported thereby are also small. The electron beam irradiating part 5 and the upper lid 11 are not secured to each other, whereby the upper lid 11 can slidably move along the z axis. Therefore, even when the upper lid 11 deforms as mentioned above, the electron beam irradiating part 5 does not follow the deformation, whereby the electron beam irradiating part 5 hardly changes its position. Hence, the exposure apparatus 1 can minimize the displacement of the electron beam irradiating part 5 and secure the relative positional accuracy between the electron beam irradiating part 5 and the wafer W and mask M.

Also, the bed 7 is hardly distorted in the exposure apparatus 1, whereby the wafer stage 25 does not deform so as to follow the distortion of the bed 7 but is constructed so as to be fixable with the clamps 39a, 39b, 39c, 39d. Therefore, fixing the wafer stage 25 to the bed 7 can suppress the movement of the wafer stage 25 due to x- and y-directional horizontal loads, etc., and secure the positional accuracy in the wafer W.

In the exposure apparatus 1, the upper lid 11, container body 9, and bed 7 are made of pure iron. This can enhance the rigidity of the bed 7. The first vacuum chamber 27 is magnetically shielded, so as to be able to block influences of external magnetic variations. Therefore, the exposure apparatus 1 can carry out stable electron beam irradiation processing. Since the bed 7 is provided with a number of cylindrical holes 7b extending from the bottom face 7t side, the weight of the bed 7 can be reduced without greatly sacrificing the rigidity of the whole bed 7, whereby the whole exposure apparatus 1 can be made lighter.

Though a bed made of granite is usually employed in a stage used under atmospheric pressure, a large amount of gas such as $H_2O$ is released from granite in vacuum, which has made it impossible for the bed made of granite to be used in vacuum. In the exposure apparatus 1, pure iron is used as a material for the bed 7, whereas the surface of the bed 7 is coated with nickel by electroless plating, so that the amount of gas released from the bed 7 is smaller even when the bed 7 is used in vacuum, whereby a high degree of vacuum can be secured in the chamber 3. The nickel plating is also effective in preventing the surface of the bed 7 from rusting, etc.

Without being restricted to the above-mentioned embodiment, the present invention can be modified in various manners. For example, though the bed 7 is formed with a number of cylindrical holes 7b extending from the bottom face 7t side, the holes 7b may have any forms as long as they can secure the rigidity of the bed 7 and reduce the weight of the bed 7. For example, holes shaped like triangular, quadrangular, or hexagonal prisms may be arranged so as to extend from the bottom face 7t side of the bed 7.

Figure 8:
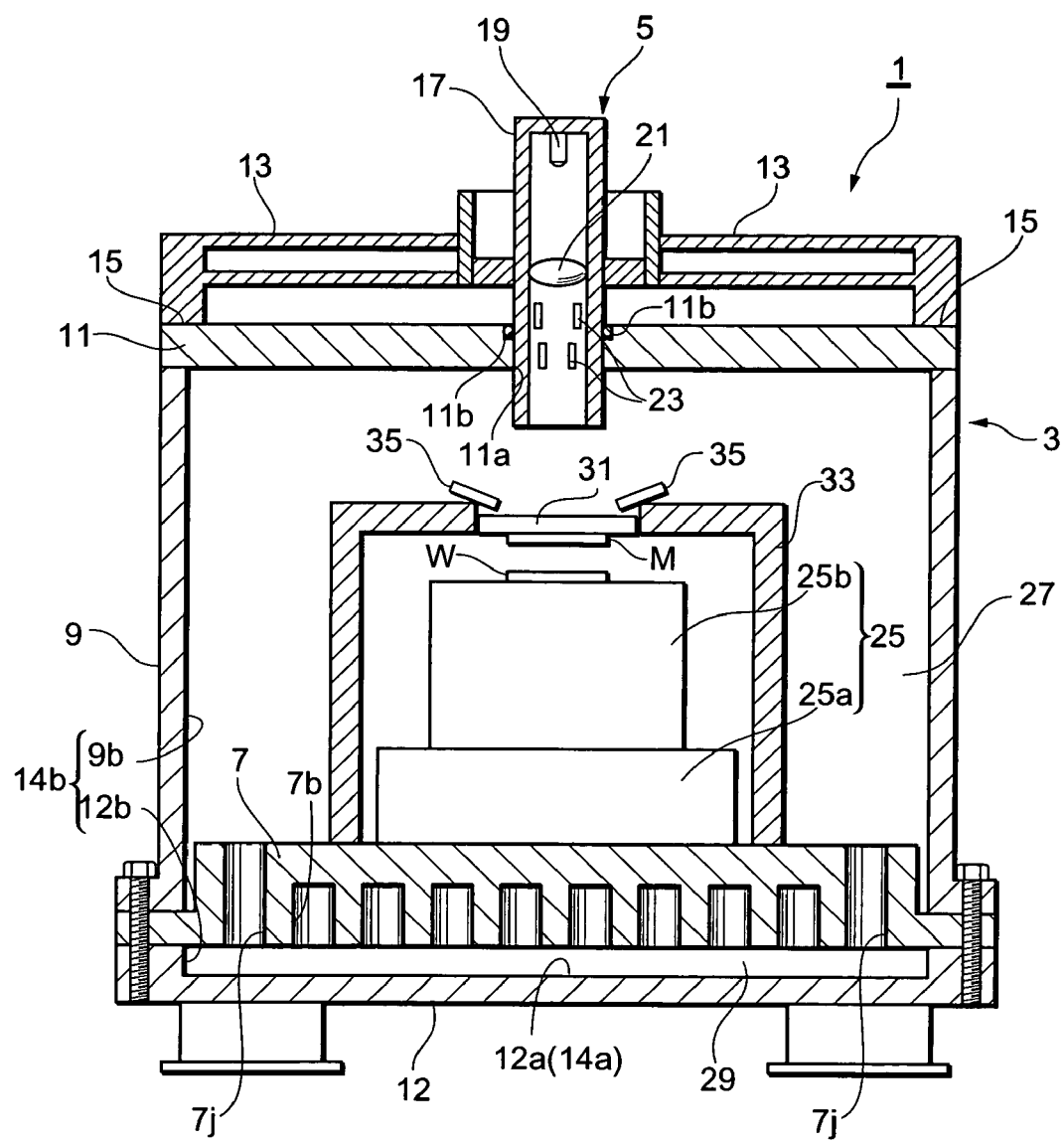
FIG. 8 is a sectional view showing a modified example of the exposure apparatus.

As shown in FIG. 8, the bed 7 may be formed with a through hole 7j, so that the first vacuum chamber 27 and the second vacuum chamber 29 communicate with each other. This makes it possible to realize a vacuum by rough evacuation from one of the first vacuum chamber 27 and second vacuum chamber 29 alone in an operation not requiring a high degree of vacuum.

Though the electron beam irradiating part 5 is secured to the corners 15 of the upper lid 11 by way of the irradiating part holders 13 in the exposure apparatus 1, it may be secured to any points where the displacement due to the evacuation of the chamber 3 is small.

Though the present invention is employed in the electron beam proximity exposure apparatus in the above-mentioned embodiment, the airtight processing apparatus in accordance with the present invention comprising the chamber 3 and bed 7 can also be employed in other sample processing apparatus for carrying out processing in vacuum. For example, the present invention is applicable to ion beam exposure apparatus, extreme ultraviolet (EUV) exposure apparatus, and the like. The present invention is also applicable to defect inspection apparatus using X-rays and electron beams, etc. In this sense, "processing a sample" encompasses defect inspections.

The airtight processing apparatus of the present invention is applicable to the processing of a sample not only under reduced pressure but also under increased pressure within the chamber 3.

From the foregoing explanations of the invention, it will be obvious that the same may be varied in many ways. Such variations are not to be regarded as a departure from the spirit and scope of the invention, and all such modifications as would be obvious to one skilled in the art are intended to be included within the scope of the following claims.

The disclosure of Japanese Patent Application No. 2003-182872 filed on Jun. 26, 2003 including the specification, drawings, and claims is incorporated herein by reference in its entirety.

What is claimed is:

1. An airtight processing apparatus comprising:
   a chamber having a side wall and a bottom wall airtightly fixed to the side wall; and
   a bed supported inside the chamber by the side wall with a gap from the bottom wall,
   wherein the side wall of the chamber has upper and lower side walls; and
   wherein the bed has an edge sandwiched between the upper and lower side walls, whereby the bed is supported by the side wall.

2. An airtight processing apparatus according to claim 1, further comprising a sample holder placed on the bed; the sample holder being attachable/detachable to the bed.

3. An airtight processing apparatus according to claim 1, wherein the bed has a plurality of holes.

4. An airtight processing apparatus according to claim 1, wherein the bed is formed from pure iron.

5. An airtight processing apparatus according to claim 1, wherein the bed has a plated surface.

6. An airtight processing apparatus according to claim 1, further comprising a vacuum pump operative to evacuate the chamber.

7. An electron beam processing apparatus comprising:
   the airtight processing apparatus according to claim 6; and
   an electron beam irradiating part that irradiates a sample with an electron beam.

8. An electron beam processing apparatus according to claim 7, wherein the chamber has an upper wall with a through hole airtightly fixed to the side wall; and
   wherein the electron beam irradiating part is provided so as to be airtightly passed through the through hole and be slidable relative thereto.

9. An electron beam processing apparatus according to claim 8, further comprising an irradiating part holder that holds the electron beam irradiating part, the irradiating part holder being provided so as to bridge an edge of the upper wall of the chamber and the electron beam irradiating part.

10. An electron beam processing apparatus according to claim 7, further comprising a mask holder that holds a mask provided with a pattern to be transferred to the sample.

11. An electron beam processing apparatus according to claim 10, wherein the electron beam processing apparatus is an electron beam proximity exposure apparatus.

12. An airtight processing method comprising the steps of supporting a bed by a side wall of a chamber with a gap from a bottom wall of the chamber; holding a sample on the bed; and processing the sample within the chamber under reduced or increased pressure, wherein the bed partitions the chamber into first and second airtight rooms; and wherein the first and second airtight rooms are maintained at substantially the same pressure.

13. An airtight processing apparatus according to claim 1, wherein the bed partitions the chamber into first and second airtight rooms.

14. An airtight processing apparatus comprising:

a chamber having a side wall and a bottom wall airtighty fixed to the side wall; and a bed supported inside the chamber by the side wall with a gap defined between the bottom wall and the bed, wherein the bed partitions the chamber into first and second airtight rooms.

* * * * *